(12) United States Patent
Ogumi

(10) Patent No.: US 11,756,912 B2
(45) Date of Patent: Sep. 12, 2023

(54) SEMICONDUCTOR DEVICE AND MANUFACTURING METHOD FOR SEMICONDUCTOR DEVICE

(71) Applicant: LAPIS Semiconductor Co., Ltd., Yokohama (JP)

(72) Inventor: Taiichi Ogumi, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 100 days.

(21) Appl. No.: 17/350,001

(22) Filed: Jun. 17, 2021

(65) Prior Publication Data

US 2021/0407945 A1 Dec. 30, 2021

(30) Foreign Application Priority Data

Jun. 29, 2020 (JP) ................. 2020-111987

(51) Int. Cl.
*H01L 23/00* (2006.01)
*H01L 29/16* (2006.01)

(52) U.S. Cl.
CPC .............. *H01L 24/13* (2013.01); *H01L 24/05* (2013.01); *H01L 24/11* (2013.01); *H01L 29/1608* (2013.01); *H01L 2224/02206* (2013.01); *H01L 2224/02215* (2013.01); *H01L 2224/0401* (2013.01); *H01L 2224/05624* (2013.01); *H01L 2224/11013* (2013.01); *H01L 2224/13147* (2013.01)

(58) Field of Classification Search
CPC ......... H01L 24/13; H01L 24/05; H01L 24/01; H01L 29/1608; H01L 2224/02206; H01L 2224/02215; H01L 2224/0401; H01L 2224/05624; H01L 2224/11013; H01L 2224/13147; H01L 2224/05124; H01L 2224/05166; H01L 2224/05647; H01L 23/3157; H01L 2224/02126; H01L 2224/02141; H01L 2224/0215; H01L 2224/03462; H01L 2224/0347; H01L 2224/0391; H01L 2224/05567; H01L 23/3171; H01L 21/048; H01L 21/4853; H01L 21/56; H01L 23/49811; H01L 23/49816; H01L 23/49838; H01L 23/49844

See application file for complete search history.

(56) References Cited

U.S. PATENT DOCUMENTS

| | | | |
|---|---|---|---|
| 2015/0294991 A1* | 10/2015 | Ishizu | G11C 8/16 257/43 |
| 2018/0204812 A1* | 7/2018 | Ogumi | H01L 24/13 |
| 2019/0267467 A1* | 8/2019 | Yoshimochi | H01L 29/7786 |
| 2021/0159315 A1* | 5/2021 | Okamoto | H01L 29/7397 |
| 2022/0367766 A1* | 11/2022 | Her | H01L 33/505 |

FOREIGN PATENT DOCUMENTS

JP 2006-005230 A 1/2006

* cited by examiner

*Primary Examiner* — Douglas W Owens
(74) *Attorney, Agent, or Firm* — Rabin & Berdo, P.C.

(57) ABSTRACT

A semiconductor device includes an SiC semiconductor substrate including a diffusion layer, a first electrode provided on the SiC semiconductor substrate, a second electrode provided on the first electrode, and a resin section that is substantially the same size in a plan view as the SiC semiconductor substrate, and that is configured to seal in the second electrode.

6 Claims, 4 Drawing Sheets

SEMICONDUCTOR DEVICE AND MANUFACTURING METHOD FOR SEMICONDUCTOR DEVICE

CROSS REFERENCE TO RELATED APPLICATION

This application is based upon and claims the benefit of priority of the prior Japanese Patent Application No. 2020-111987, filed on Jun. 29, 2020, the entire contents of which are incorporated herein by reference.

TECHNICAL FIELD

The present invention relates to a semiconductor device and a manufacturing method for a semiconductor device.

BACKGROUND ART

Wafer-level chip scale packaging (WL-CSP) is a packaging technique for semiconductor devices in which rewiring, electrode formation, resin sealing, and dicing are performed through a wafer process. Japanese Patent Application Laid-Open Publication No. 2006-5230, for example, discloses a semiconductor device in a WL-CSP and a manufacturing method therefor.

SUMMARY OF THE INVENTION

Silicon carbide (SiC) is a material that allows for smaller scale devices, reduced power consumption, increased efficiency, and the like compared to silicon (Si), and is therefore a highly useful material.

However, the manufacturing method disclosed in Japanese Patent Application Laid-Open Publication No. 2006-5230 assumes the use of a semiconductor substrate made of a material such as Si (see paragraph [0019], for example), and the use of SiC is not considered.

The present invention takes into consideration the above points, and an object thereof is to improve the reliability of a semiconductor device including a semiconductor substrate made of SiC in a WL-CSP.

A semiconductor device according to a first aspect of the present invention includes: an SiC semiconductor substrate including a diffusion layer; a first electrode provided on the SiC semiconductor substrate; a second electrode provided on the first electrode; and a resin section that is substantially the same size in a plan view as the SiC semiconductor substrate, and that is configured to seal in the second electrode.

A manufacturing method for a semiconductor device according to the present invention includes: a step of disposing a prescribed mask material on a substrate including an SiC semiconductor substrate having a diffusion layer and a first electrode provided on the SiC semiconductor substrate, and forming a second electrode on the first electrode; and a step of forming a resin section so as to seal in the second electrode after removing the prescribed mask material.

According to the present invention, it is possible to improve the reliability of a semiconductor device including a semiconductor substrate made of SiC in a WL-CSP.

DETAILED DESCRIPTION OF EMBODIMENTS

Figure 1:
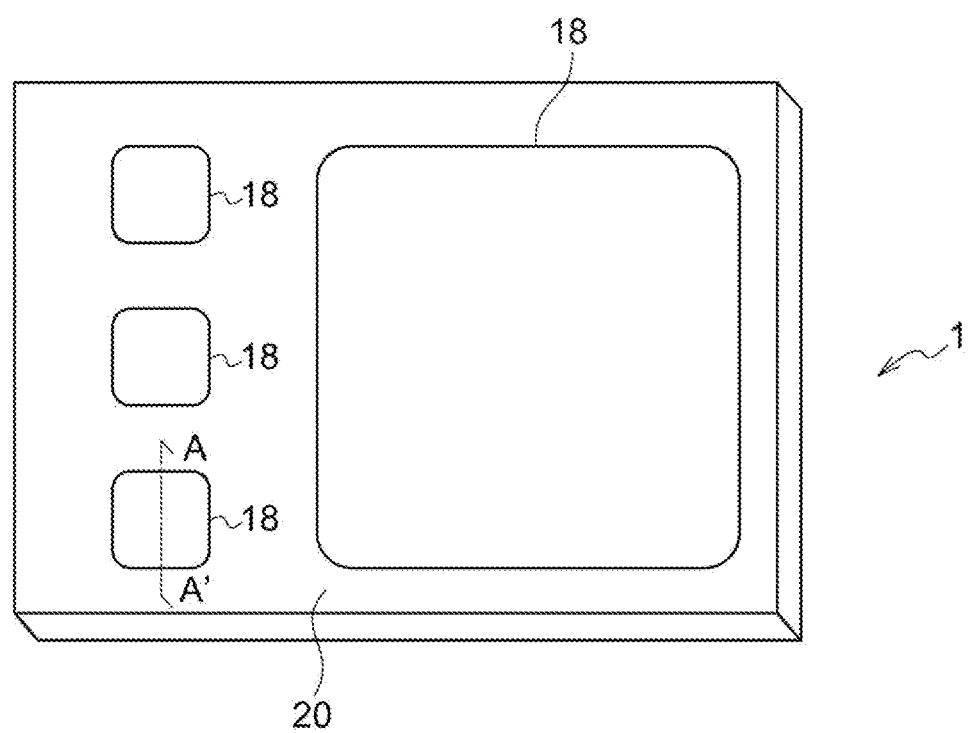
FIG. 1 shows an overall configuration of a semiconductor device according to the present embodiment (Embodiment 1).

Embodiments of the present invention will be explained below with reference to the drawings. Substantially same or equivalent components or portions in the drawings are assigned the same reference characters.

Embodiment 1

Figure 2A:
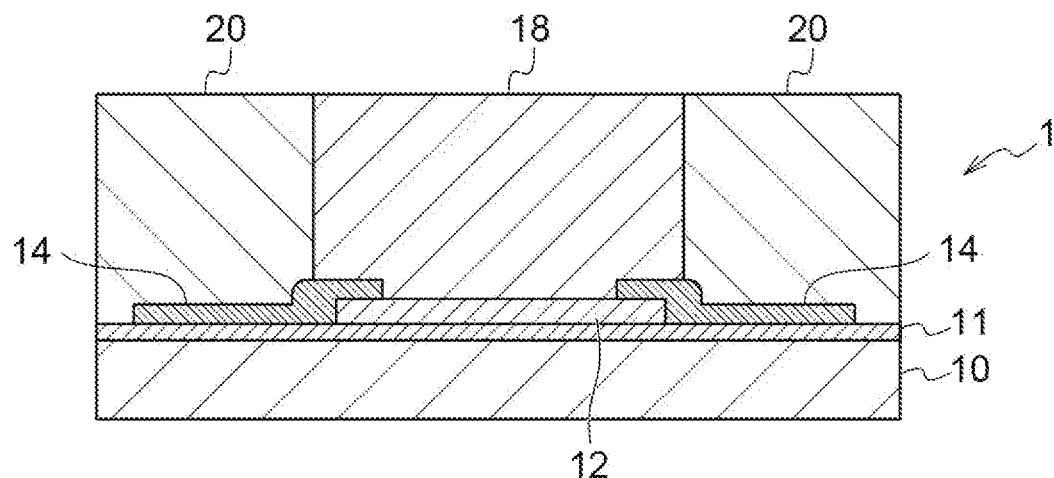
FIG. 2A is an expanded cross-sectional view of the configuration of a portion of a semiconductor device according to Embodiment 1.

FIG. 1 shows an overall configuration of a semiconductor device 1 according to Embodiment 1. FIG. 2A is an expanded cross-sectional view of the configuration of a portion of the semiconductor device 1 along the line A-A' of FIG. 1.

The semiconductor device 1 includes an SiC semiconductor substrate 10 that includes a diffusion layer 11, and a first electrode 12 provided on the SiC semiconductor substrate 10. The semiconductor device 1 additionally includes a second resin section 14 that is in contact with the first electrode 12, a second electrode 18 provided on the first electrode 12, and a first resin section 20.

The first resin section 20 has the same size in a plan view as the SiC semiconductor substrate 10, and is provided so as to seal in the second electrode 18. In a top view of the semiconductor device 1 such as that of FIG. 1, for example, the first resin section 20 is formed along each side of the SiC semiconductor substrate 10 so as to be substantially the same size in a plan view as the rectangular SiC semiconductor substrate 10. The first electrode 12 is made of Al or the like, for example. The second electrode 18 is made of Cu or the like.

In the semiconductor device 1, the package takes the form of a WL-CSP. In other words, the plan view size of the package of the semiconductor device 1 is substantially the same as that of the SiC semiconductor substrate 10.

The surface of the semiconductor substrate 10 including the diffusion layer 11 has formed thereon circuit elements (not shown) such as transistors, resistors, and capacitors. The surface of the SiC semiconductor substrate 10 is covered by an interlayer insulating film (not shown) made of an insulator such as $SiO_2$.

The surface of the interlayer insulating film is provided with the first electrode 12 that is connected to the circuit elements formed on the SIC semiconductor substrate 10, and is provided with the second resin section 14 having an opening that partially exposes the surface of the first electrode 12. As shown in FIG. 2A, the second resin section 14 is in contact with the first electrode 12. The second resin section 14 is a so-called passivation film made of a photosensitive organic insulating material such as a polyimide resin.

Below, a manufacturing method for the semiconductor device 1 of Embodiment 1 will be described with reference to FIGS. 2B to 2E. FIGS. 2B to 2E are cross-sectional views showing manufacturing steps for the semiconductor device 1.

Figure 2B:
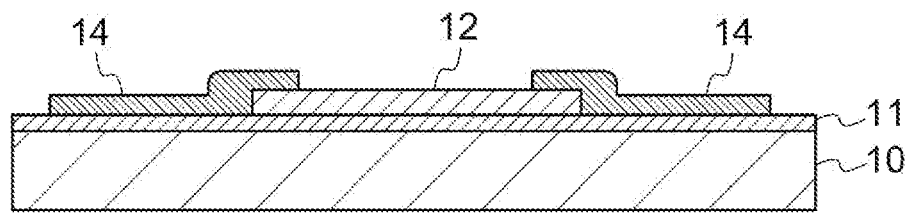
FIG. 2B is a cross-sectional view showing one example of a manufacturing step for the semiconductor device according to Embodiment 1.

First, a semiconductor wafer in which the manufacturing process for the SiC semiconductor substrate 10 including the diffusion layer 11 has been completed is prepared (FIG. 2B). The manufacturing process for the SiC semiconductor substrate 10 includes a step of forming a circuit element (not shown) such as a transistor on the SiC semiconductor substrate 10, a step of forming an interlayer insulating film made of an insulator such as $SiO_2$ on the surface of the SiC semiconductor substrate 10, a step of forming the first electrode 12 on the surface of the interlayer insulating film, and a step of forming the second resin section 14 so as to partially expose the first electrode 12.

Next, a UBM (under-bump metallization) film (not shown) that covers the surface of the first electrode 12 exposed at the opening of the second resin section 14 is formed. The UBM film is formed by sequentially depositing a Ti film and a Cu film by a known sputtering technique, for example.

Next, using a publicly known photolithography technique, a dry film, which is an example of a prescribed mask material 16 having an opening, is disposed and pasted on the surface of the UBM film. The dry film takes the form of a film and is formed on the surface of the UBM film through exposure and developing.

Figure 2C:
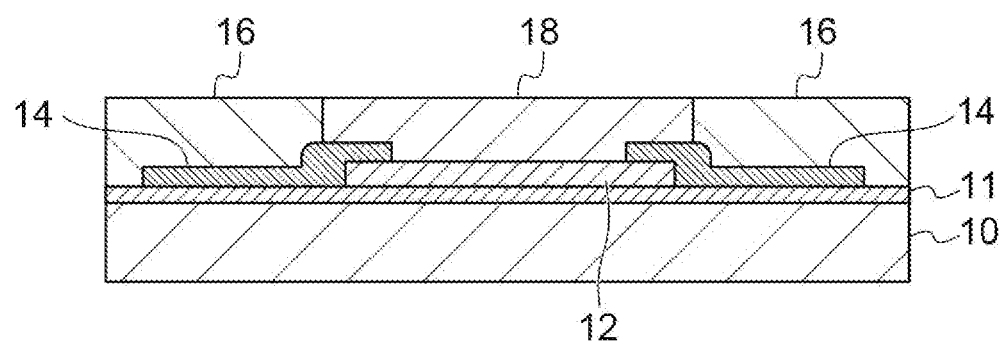
FIG. 2C is a cross-sectional view showing one example of a manufacturing step for the semiconductor device according to Embodiment 1.

Next, the second electrode 18 is formed on the surface of the UBM film by the known electroplating technique (FIG. 2C). Specifically, the surface of the SiC semiconductor substrate 10 is soaked in a plating solution and a current is supplied to a plating electrode (not shown) connected to the UBM film. As a result, metal is deposited on the exposed portion of the UBM film (plating seed layer), thereby forming the second electrode 18 on the UBM film. Cu can be used as a material for the second electrode 18, for example.

Figure 2D:
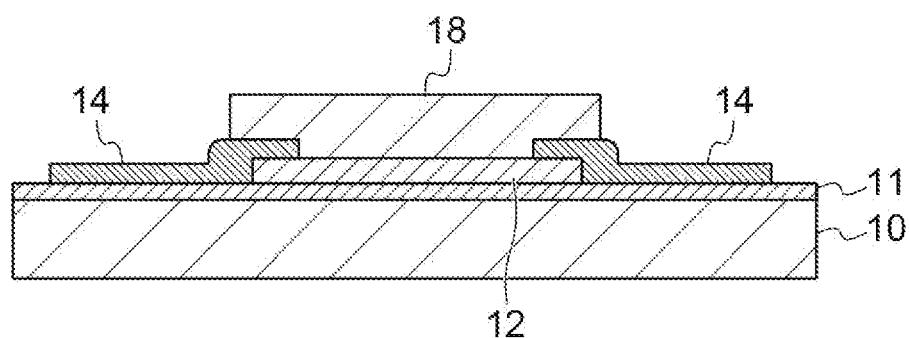
FIG. 2D is a cross-sectional view showing one example of a manufacturing step for the semiconductor device according to Embodiment 1.
Figure 2E:
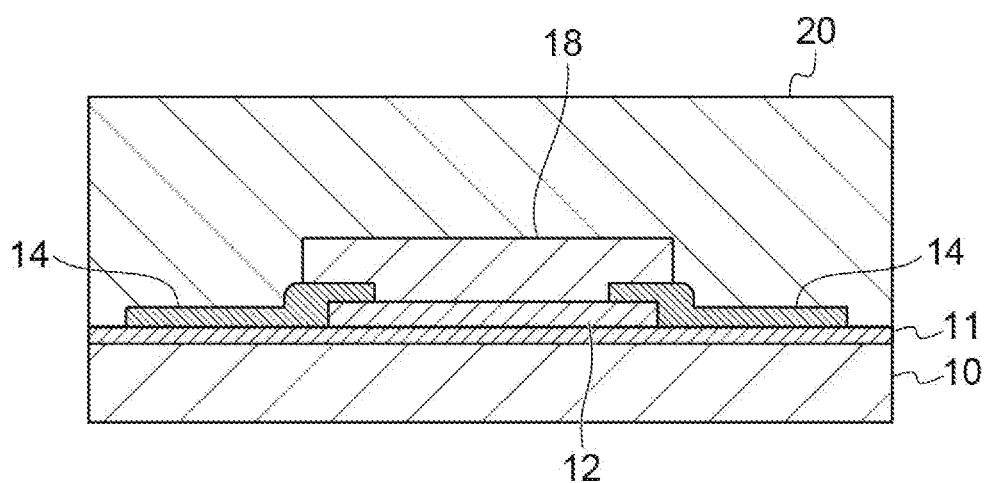
FIG. 2E is a cross-sectional view showing one example of a manufacturing step for the semiconductor device according to Embodiment 1.

After forming the second electrode 18, the mask material 16 is removed through a publicly known process (FIG. 2D). Thus, the second electrode 18 is formed. Then, a known etching process is performed on the second electrode 18.

Then, using a publicly known process, for example, a photosensitive organic resin material such as a polyimide or PBO (polybenzoxazole) is formed on the surface of the structure resulting from the above-mentioned processes, and is subjected to the known photolithography technique (e.g., a photolithography technique including coating, exposure, developing, curing, etc.) to form the semiconductor device 1 including the first resin section 20 such as that shown in FIG. 2A. The photosensitive organic insulating material such as a polyimide or PBO may be an epoxy resin, and in such a case, by polishing the first resin section 20 such as that shown in FIG. 2E after coating the same, the semiconductor device 1 including the first resin section 20 such as that shown in FIG. 2A is formed.

According to the semiconductor device 1 and the manufacturing method therefor of Embodiment 1, by providing the first resin section 20 so as to seal in the second electrode 18 on the SiC semiconductor substrate 10, it is possible to improve the reliability of the semiconductor device having a semiconductor substrate made of SiC in a WL-CSP. Also, it is possible to use the first resin section 20 as a support substrate when thinning the SiC semiconductor substrate 10 in order to reduce ON-state resistance. Thus, it is possible to improve the reliability of the semiconductor device including the SiC semiconductor substrate.

Also, according to the semiconductor device 1 and the manufacturing method therefor of Embodiment 1, it is possible to further improve reliability by setting the thickness of the first resin section 20 to be greater than the diameter of the filler material used for the first resin section 20. Additionally, in forming the first resin section 20, by adjusting the position at which the mask material 16 is disposed, it is possible to form the second electrode 18 according to the area of the opening the first resin section 12. If a polyimide, PBO, or the like is used for the first resin section 20, it is possible to reduce the thickness thereof, thereby achieving the effect of low stress thereon. If an epoxy resin is used for the first resin section 20, it is possible to block light if the epoxy resin is black, and it is possible to achieve increased mechanical strength.

Embodiment 2

Figure 3:
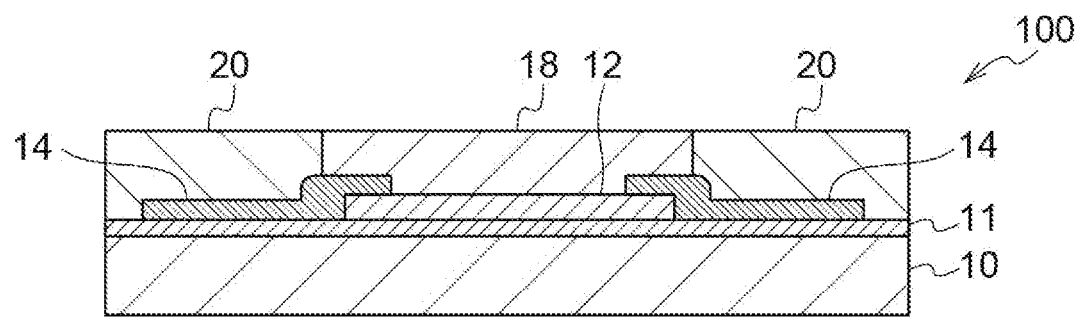
FIG. 3 is an expanded cross-sectional view of the configuration of a portion of a semiconductor device according to Embodiment 2.

FIG. 3 is a cross-sectional view of a semiconductor device 100 according to Embodiment 2.

The semiconductor device 100 of Embodiment 2 is similar in configuration to Embodiment 1, and includes an SiC semiconductor substrate 10 that includes a diffusion layer 11, and a first electrode 12 provided on the SiC semiconductor substrate 10. The semiconductor device 1 additionally includes a second resin section 14 that is in contact with the first electrode 12, a second electrode 18 provided on the first electrode 12, and a first resin section 20. The first resin section 20 has the same size in a plan view as the SiC semiconductor substrate 10, and is provided so as to seal in the second electrode 18.

Next, a manufacturing method for the semiconductor device 100 of Embodiment 2 will be described. The manufacturing method for the semiconductor device 100 of Embodiment 2 differs from that of Embodiment 1 in that the prescribed mask material for forming the second electrode 18 is a liquid resist in the case of Embodiment 2.

As a result, the thickness of the second electrode 18 of the semiconductor device 100 manufactured by the manufacturing method of Embodiment 2 is less than the thickness of the second electrode 18 of the semiconductor device 1 manufactured by the manufacturing method of Embodiment 1. Similarly, the thickness of the first resin section 20 of the semiconductor device 100 manufactured by the manufacturing method of Embodiment 2 is less than the thickness of the first resin section 20 of the semiconductor device 1 manufactured by the manufacturing method of Embodiment 1.

Other aspects of the semiconductor device and the manufacturing method therefor of Embodiment 2 are similar to those of Embodiment 1, and thus, descriptions thereof are omitted.

According to the semiconductor device 100 and the manufacturing method therefor of Embodiment 2, by providing the first resin section 20 so as to seal in the second electrode 18 on the SiC semiconductor substrate 10, it is possible to improve the reliability of the semiconductor device having a semiconductor substrate made of SiC in a WL-CSP. Also, a liquid resist is used as the prescribed mask material when forming the second electrode 18, allowing for reduced manufacturing costs.

Embodiment 3

Figure 4:
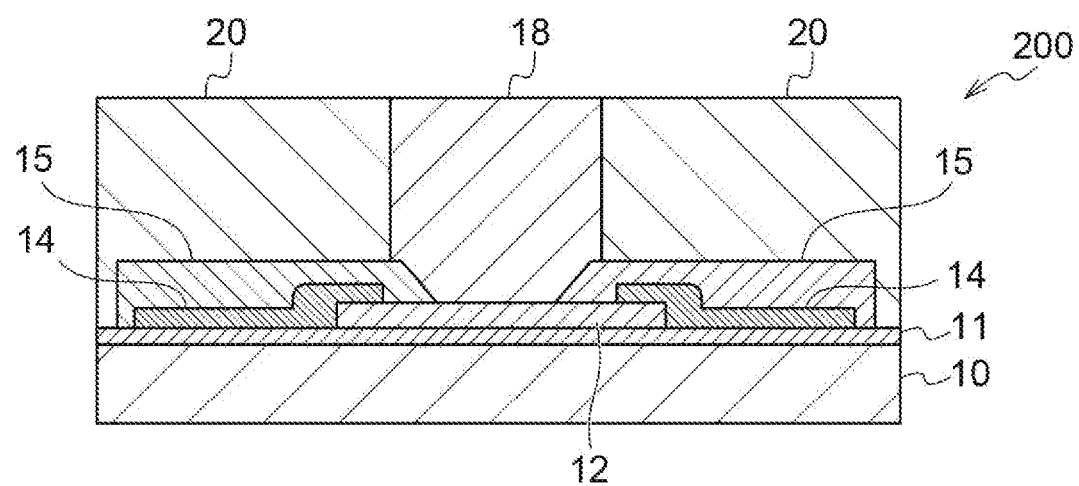
FIG. 4 is an expanded cross-sectional view of the configuration of a portion of a semiconductor device according to Embodiment 3.

FIG. 4 is a cross-sectional view of a semiconductor device 200 according to Embodiment 3.

The semiconductor device 200 of Embodiment 3 further includes a third resin section 15 provided so as to be in contact with the first electrode 12 and the second electrode 18 in addition to the configuration of the semiconductor device 1 of Embodiment 1 or the semiconductor device 100 of Embodiment 2. As shown in FIG. 4, the opening of the third resin section 15 is smaller than the opening of the second resin section 14.

Next, a manufacturing method for the semiconductor device 200 of Embodiment 3 will be described.

The manufacturing method for the semiconductor device 200 of Embodiment 3 further includes a step of forming the third resin section 15 having a smaller opening than the opening of the second resin section 14 on a substrate including the SiC semiconductor substrate 10, the first electrode 12, and the second resin section 14 in contact with the first electrode 12, in addition to the steps of the manufacturing method of Embodiment 1 or the manufacturing method of Embodiment 2.

Specifically, the third resin section 15 having a smaller opening than that of the second resin section 14 is formed on the substrate, which is a semiconductor wafer, in which the manufacturing process for the SiC semiconductor substrate 10 including the diffusion layer 11 has been completed, such as that shown in FIG. 2A. The third resin section 15 is a photosensitive organic insulating material such as PBO, for example.

A UBM film (not shown) that covers the surface of the first electrode 12 exposed at the opening of the third resin section 15 is formed. The second electrode 18 is formed after forming the third resin section 15 and the UBM film on the SiC semiconductor substrate 10.

Other aspects of the semiconductor device and the manufacturing method therefor of Embodiment 3 are similar to those of Embodiment 1 or 2, and thus, descriptions thereof are omitted.

According to the semiconductor device 200 and the manufacturing method therefor of Embodiment 3, by providing the first resin section 20 so as to seal in the second electrode 18 on the SiC semiconductor substrate 10, it is possible to improve the reliability of the semiconductor device having a semiconductor substrate made of SiC in a WL-CSP. By providing the third resin section 15, it is possible to provide the second electrode 18 at the smallest size necessary for wafer bonding. Specifically, the opening of the third resin section 15 can be made smaller than that of the second resin section 14, and thus, it is possible to reduce the amount of metal used for the second electrode 18. As a result, it is possible to reduce the amount of power supplied for electroplating when forming the second electrode 18.

What is claimed is:

1. A semiconductor device, comprising:
   an SiC semiconductor substrate including a diffusion layer;
   a first electrode provided on the SiC semiconductor substrate;
   a second electrode provided on the first electrode; and
   a resin section that is substantially a same size in a plan view as the SiC semiconductor substrate, and that is configured to seal in the second electrode,
   wherein the second electrode has a lower surface in contact with the first electrode.

2. The semiconductor device according to claim 1, wherein the second electrode has side walls extending from the lower surface and contacting the resin section.

3. A semiconductor device, comprising:
   an SiC semiconductor substrate including a diffusion layer;
   a first electrode provided on the SiC semiconductor substrate;
   a second electrode provided on the first electrode; and
   a resin section that is substantially a same size in a plan view as the SiC semiconductor substrate, and that is configured to seal in the second electrode,
   wherein the resin section is a first resin section,
   wherein the semiconductor device further comprises:
   a second resin section in contact with the first electrode; and
   a third resin section provided so as to be in contact with the first electrode and the second electrode, and
   wherein an opening of the third resin section is smaller than an opening of the second resin section.

4. A manufacturing method for a semiconductor device, comprising:
   a step of disposing a prescribed mask material on a substrate including an SiC semiconductor substrate having a diffusion layer and a first electrode provided on the SiC semiconductor substrate, and forming a second electrode on the first electrode; and
   a step of forming a resin section so as to seal in the second electrode after removing the prescribed mask material;
   wherein the resin section is a first resin section,
   wherein the method further comprises: a step of forming a third resin section having a smaller opening than an opening of a second resin section on a substrate including the SiC semiconductor substrate, the first electrode, and the second resin section, the second resin section being in contact with the first electrode, and
   wherein, in the step of forming the second electrode, the second electrode is formed after forming the third resin section on the substrate including the SiC semiconductor substrate, the first electrode, and the second resin section.

5. The manufacturing method for a semiconductor device according to claim 4,
   wherein the prescribed mask material is a film-type resist.

6. The manufacturing method for a semiconductor device according to claim 4,
   wherein the prescribed mask material is a liquid resist.

* * * * *